(12) United States Patent
Ayyapureddi

(10) Patent No.: US 11,979,147 B2
(45) Date of Patent: May 7, 2024

(54) APPARATUSES, SYSTEMS, AND METHODS FOR MEMORY INITIATED CALIBRATION

(71) Applicant: MICRON TECHNOLOGY, INC., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 111 days.

(21) Appl. No.: 17/890,568

(22) Filed: Aug. 18, 2022

(65) Prior Publication Data

US 2024/0063794 A1 Feb. 22, 2024

(51) Int. Cl.
*H03K 19/00* (2006.01)
*H03K 19/08* (2006.01)
*H03K 19/17736* (2020.01)

(52) U.S. Cl.
CPC ..... *H03K 19/0005* (2013.01); *H03K 19/0813* (2013.01); *H03K 19/17744* (2013.01)

(58) Field of Classification Search
None
See application file for complete search history.

(56) References Cited

U.S. PATENT DOCUMENTS

| | | | |
|---|---|---|---|
| 2016/0254812 A1* | 9/2016 | Miwa | H03K 19/0005 326/30 |
| 2017/0345483 A1* | 11/2017 | Wang | H04L 25/0278 |
| 2018/0019751 A1* | 1/2018 | Jeong | H03K 19/0005 |
| 2019/0103889 A1* | 4/2019 | Srivastava | G06F 13/4072 |

* cited by examiner

*Primary Examiner* — Anh Q Tran
(74) *Attorney, Agent, or Firm* — Dorsey & Whitney LLP

(57) ABSTRACT

Apparatuses, systems, and methods for memory initiated calibration. The memory includes a termination circuit with a tunable resistor and a calibration detection circuit with a replica tunable resistor. The calibration detection circuit measures a resistance of the replica tunable resistor and provides a calibration request signal if the resistance is outside a tolerance. Responsive to the calibration request signal, a controller of the memory schedules the memory for a calibration operation.

21 Claims, 5 Drawing Sheets

US 11,979,147 B2

APPARATUSES, SYSTEMS, AND METHODS FOR MEMORY INITIATED CALIBRATION

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). During a read operation the physical signal (e.g., the charge) may be coupled to a conductive element to cause a change in voltage. That change in voltage may be amplified and read out to input/output terminals of the device. A write operation may reverse the process, receiving a signal at the terminals and providing a voltage to the memory cell (e.g., to charge the capacitor).

Since voltages may be rapidly applied to the terminals, it may be important to prevent stray voltages from being reflected where the terminal interfaces with outside devices. The memory may have multiple selectable termination legs which are used to match impedance. It may be important to tune the resistance of the termination resistors.

DETAILED DESCRIPTION

Figure 1:
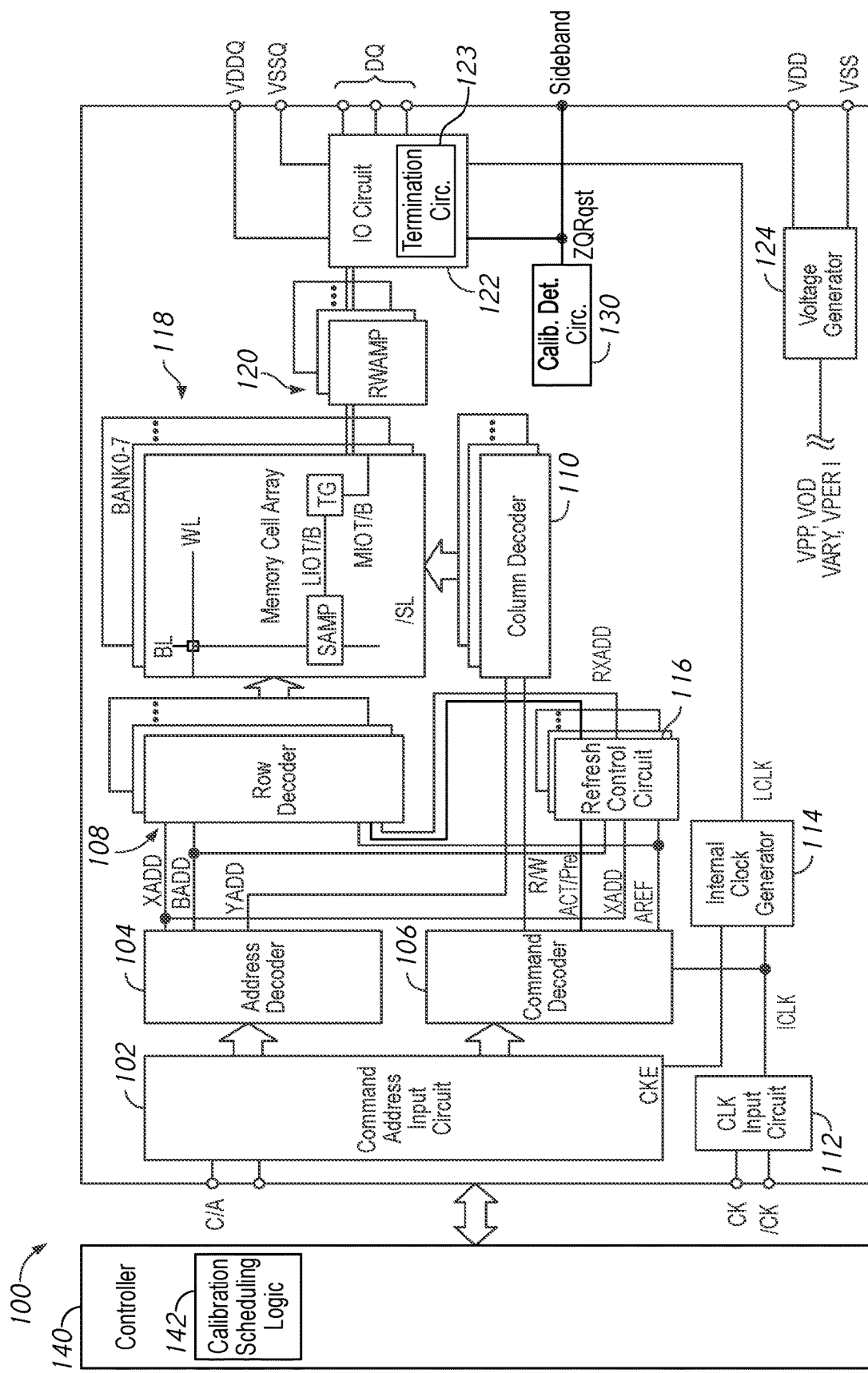
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a memory device is stored in a memory array. The information is conveyed as voltages along various internal signal lines. For example, a first voltage may represent a logical high, while a second voltage may represent a logical low. During access operations, such as read and write operations, the signals may be passed to and from the device between data terminals (DQ terminals) of the device and a data bus (DQ) bus which couples the device to a controller. The memory includes input/output (IO) circuits which couple the internal signals to the DQ terminals and DQ bus. The IO circuit includes a termination circuit, which includes one or more selectable resistive legs, each of which include a tunable resistor. The resistive legs may be coupled in parallel, and a number of the resistive legs which are active (e.g., a number of the tunable resistors coupled in parallel) may determine an overall impedance of the termination circuit. This in turn, ensures that the impedance along the line (e.g., the DQ bus) matches the impedance of the terminals (e.g., as set by the termination circuit) to help ensure that there aren't voltage reflections at the DQ terminal. This may be especially important in a memory module, where multiple memory devices may share the same DQ terminals.

The tunable resistors in the resistive legs are calibrated to ensure that the impedance of the terminal matches the expected value. The module includes a reference resistor, ZQ, which is used to calibrate the tunable resistors in the termination circuit. For example, the controller may issue a calibration command and specify a memory. The memory accesses the reference resistor and adjusts the tunable resistors until the value of the tunable resistors matches the value of the reference resistor. However, this may consume system bandwidth, as the controller may issue calibration commands even to memories where a calibration is not needed. There may thus be a need for the memory itself to recognize when a calibration is needed.

The present disclosure is drawn to memory initiated calibration. The memory includes a calibration detection circuit. The calibration detection circuit includes a replica resistive leg which is a replica of one of the resistive legs in the termination circuit of the memory. The replica resistive leg may be calibrated along with the resistive leg(s) when the memory is calibrated. Similarly, the replica resistive leg may be located in physical proximity to the resistive legs (e.g., for temperature matching). Accordingly, the replica resistive leg may replicate an impedance of each of the resistive legs in the termination circuit. The calibration detection circuit measures a resistance of the replica resistive leg and determines if the measured resistance is within a tolerance of an expected value. If the calibration detection circuit determines that the replica resistive leg is outside of a tolerance from a nominal value, then the calibration detector circuit may notify a controller that the memory requires a calibration. In some embodiments, the calibration detection circuit may include a filter to ensure that the replica calibration leg being outside the nominal impedance is not a transient phenomenon.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. For example, memories may include 4, 16, 32 more or fewer banks. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL and /BL is performed by a column decoder 110. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ. The external terminals may be coupled to a controller 140 which may operate the memory by providing various signals to the external terminals.

The controller 140 provides the clock terminals with external clocks CK and/CK from the that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The controller 140 provides the C/A terminals with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The controller 140 may provide the C/A terminals with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The control commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line. The command decoder 106 also provides activation and pre-charge signals to the different banks of the memory. An activation signal ACT may indicate that a word line in that bank should be activated, while a pre-charge signal Pre may indicate that the word lines should be pre-charged (e.g., closed) in anticipation of a next activation command. In some embodiments, the ACT and Pre signals may share a signal line.

The device 100 may receive commands and addresses from the controller 140 as part of an access operation such as a read operation. As part of the access operation, a row address and bank address received along with an activate command. As part of the access operation, a column address and bank address are received along with a read command. Responsive to the read operation, read data is read from memory cells in the memory array 118 corresponding to the row address and column address. The commands associated with the read operation are received by the command decoder 106, which provides internal commands so that read data from the memory array 118 is provided to the read/write amplifiers 120. Responsive to the activate command the row decoder 108 activates a word line associated with the row address. While the row is active, memory cells along that row are coupled to sense amplifiers activated by the column decoder 110 responsive to the read command to read data out along the LIOT/B lines. The read data is output to outside from the data terminals DQ via the input/output circuit 122. The command decoder 106 may then provide a pre-charge command which may 'close' the active row.

The device 100 may receive commands and addresses from the controller 140 as part of an access operation such as a write operation. As part of the write operation, a row address and bank address are received along with an activated command and a column address and bank address are received along with write data and a write command. Responsive to the write operation, write data supplied to the data terminals DQ is written to a memory cells in the memory array 118 corresponding to the row address and column address. The commands associated with the write operation are received by the command decoder 106, which provides internal commands so that the write data is received by data receivers in the input/output circuit 122. Responsive to the activate command the row decoder 108 activates a word line associated with the row address. While the row is active, memory cells along that row are coupled to sense amplifiers activated by the column decoder 110 responsive to the write command to receive write data. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. The command decoder 106 may then provide a pre-charge command which may 'close' the active row.

The device 100 may also perform refresh operations. The refresh operations may be performed as part of an auto-refresh operation, where a controller 140 issues an auto-refresh command or as part of a self-refresh operation, where the memory refreshes itself based on internal commands. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may be controlled to change details of the refreshing address RXADD (e.g., how the refresh address is calculated, the timing of the refresh addresses, the number of wordlines represented by the address), or may operate based on internal logic.

The IO circuit 122 includes a termination circuit 123. The termination circuit 123 provides a calibrated impedance value to the DQ terminals, for example to match the impedance of the DQ terminals to the line impedance of the DQ bus between the DQ terminals and the controller 140. The termination circuit 123 includes a number of tunable resistors, which may be selectively coupled to the DQ terminals to provide a chosen impedance. The chosen impedance may be setting based on properties of the controller and/or DQ bus. For example, the termination circuit 123 includes a number of selectable resistive legs, each with a tunable resistor of NO. If X of the tunable legs are active, then the overall value may be (N/X) Q. For example, if 2400 resistors are used, then overall values such as 600 (four active legs), 400 (six active legs), and 300 (seven active legs) may be selected. Other values of the resistor and other numbers of legs may be used in other example embodiments.

Each of the tunable resistors may be adjustable in order to ensure that the impedance can be matched to a nominal value (for example, to ensure that each tunable resistor matches a value of 2400). The memory may have access to a reference resistor ZQ (not shown in FIG. 1) which has the nominal value. The reference resistor ZQ may be a resistor manufactured with extremely narrow tolerances (e.g., 5%, 1%, or 0.1% etc.) As part of the calibration operation, the resistance of each of the tunable resistors of the termination circuit 123 is adjusted to match the resistance of the reference resistor ZQ.

The memory includes a calibration detection circuit 130 which determines if the memory device 100 requires calibration or not. If the calibration detection circuit 130 determines that a calibration is required, it may provide a calibration request signal ZQRqst to the controller 140. The calibration request may be provided along in-band channels of the memory device 100 (e.g., via the DQ terminals), may be provided along sideband channels (e.g., other connections such as alert pins) or combinations thereof. In response the controller 140 may send a calibration command to the memory device 100. The controller 140 may have scheduling logic 142 to determine when the calibration command should be provided. For example, if reference resistor is shared by multiple memories, and multiple memories provide the calibration requests ZQRqst, the calibration scheduling logic 142 determines which memory receives a calibration command and in what order. In some embodiments, the calibration scheduling logic 142 may include additional logic and may periodically issue calibration commands and/or provide a calibration command if enough time has elapsed since the last calibration.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
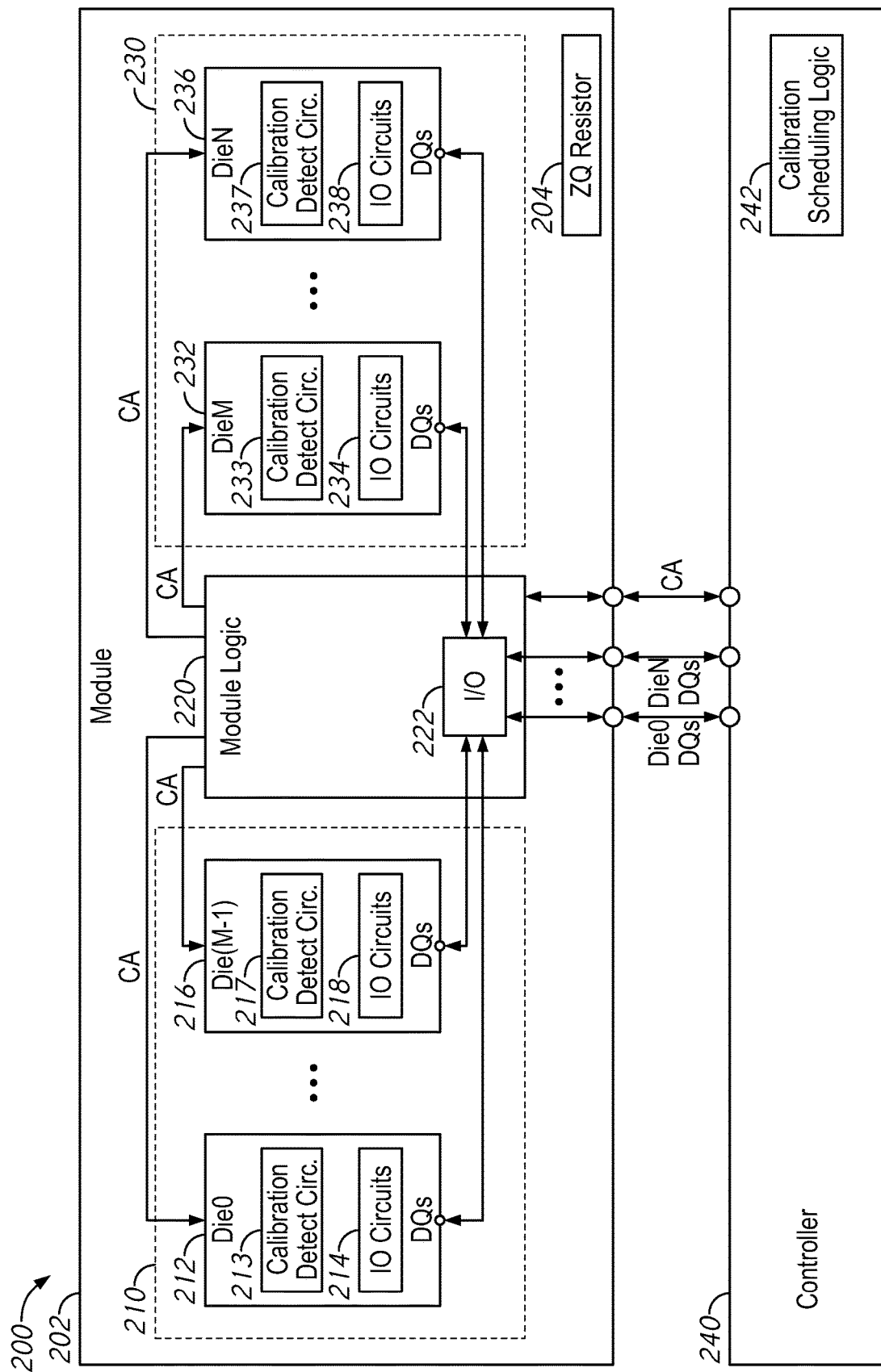
FIG. 2 is a block diagram of a memory system according to some embodiments of the present disclosure.

FIG. 2 is a block diagram of a memory system according to some embodiments of the present disclosure. The example of FIG. 2 shows an embodiment where multiple memories are packaged together into a memory module 202. The termination circuitry may especially be important in such an embodiment, as certain memory dies may share external DQ terminals. Accordingly, when one memory coupled to the shared terminal is accessed, reflections at the terminal may cause signals to be improperly sent to the other, non-accessed, memory coupled to that terminal. However, it should be appreciated that the embodiments of the present disclosure may work both in stand-alone memories and in memories packaged together into modules.

The memory system 200 includes a module 202 and a controller 240. The memory module 202 includes a number of memory dice 212, 216, 232, and 236. In some embodiments, each of the memory dice 212, 216, 232, and 236 may be implemented by the memory device 100 of FIG. 1. The memory module 202 includes module logic 220 which manages access to the memory dice on the module 202. For example, the module logic 220 may include an input/output circuit 222 which may act as a buffer to provide signals between the terminals of the memory dice and the external terminals of the module 202. The external terminals of the module 202 interface with the controller 240. The module 202 also includes a reference resistor 204, which is used in calibration operations.

The memory module includes a number of memory dies, organized into channels. Memory dies 212 and 216 are shown as part of a first channel 210, and memory dies 232 and 236 are shown as part of a second channel 230. Each channel may have a number of memory dies. For example, each channel may have 5 memory dies. More or fewer dies per channel may be used in other example embodiments. Similarly, the module 202 may have more or fewer channels. For example, FIG. 2 shows two channels 210 and 230, one on either side of module logic 220. There may be additional channels (and additional memory dies) located on the back of the physical module chip, for a total of 4 channels. More or fewer than 4 channels may be used in other example embodiments.

Since the memory dies may generally be similar, only the operation of a single example memory die will be discussed with respect to the operation of the module 202. The module 202 is coupled to the controller 240 along a set of terminals. Example command/address (CA) terminals, along with sets of the data input/output (DQ) terminals are shown, however additional terminals and connections may exist in other example embodiments. During an example read operation, the controller 240 provides the read command along with die identification information, which specifies the channel (and/or the individual die) to be accessed along with the row address, column address, and bank address to be accessed within the memory. The module logic 220 routes the C/A signals to the memory dies, and the specified die, in this example Die0 212, responds. The specified Die reads data from the specified row, bank, and column, and provides that data via 10 circuit 214 (e.g., 122 of FIG. 1) along internal signal lines to the module IO circuit 222, which routes the data to external data terminals.

Each die on the module 202 is associated with a set of external DQ terminals. The external DQ terminals may be shared by multiple dies. For example, the memory Die0 212 has 16 DQ terminals, each of which corresponds to one of 16 external Die0 DQ terminals on the module. Those 16 external Die0 DQ terminals may also be used by another die (e.g., located on the backside of the module 202) which is part of a different channel. Other arrangements of DQ terminal sharing may be used in other example embodiments.

Each die, such as Die0 212, includes a calibration detection circuit 213 (e.g., 130 of FIG. 1). The calibration detection circuit 213 determines if a replica resistive leg which mimics the resistive legs of the termination circuit in the IO circuit 214 is within a tolerance or not. If not, the die 212 provides a calibration request signal (e.g., ZQRqst of FIG. 1) to the controller. The calibration request signal may be provided along in-band channels (e.g., the DQs) and/or along out-band channels. The calibration request signal may include an indication of which memory die provided the calibration request signal. In some embodiments, the calibration request signal may include a die identifier. In some embodiments, the manner in which the calibration request signal is provided may indicate the originating memory (e.g., if the calibration request is provided along the Die0 DQs, then the request is associated with Die0).

Figure 3:
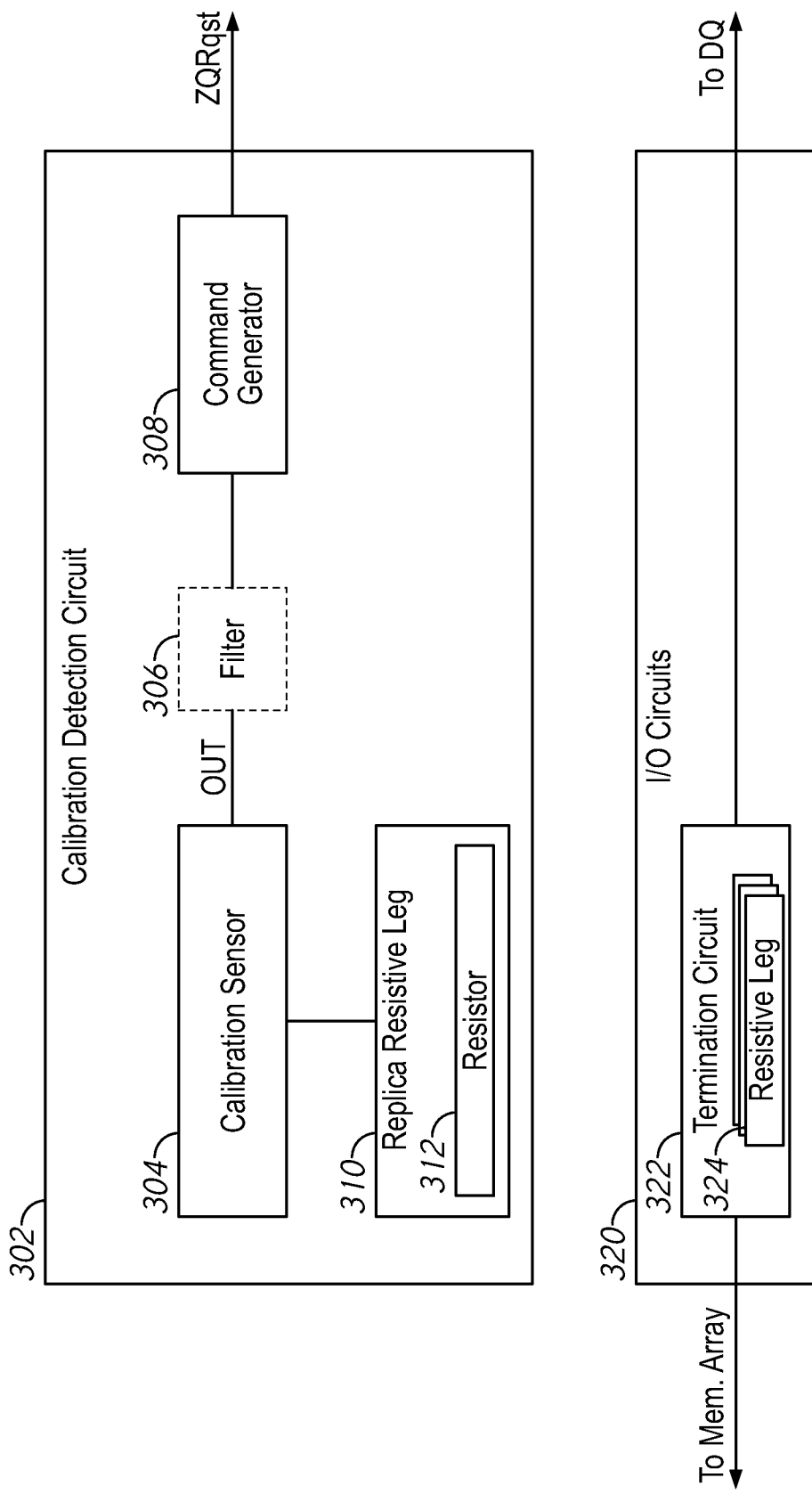
FIG. 3 is a block diagram of a calibration detection circuit according to some embodiments of the present disclosure.

The calibration scheduling logic 242 receives the calibration request signal and determines when the controller 240 should provide a calibration command to the specified memory. The calibration scheduling logic 242 provides a calibration command to the specified die. Responsive to the calibration command, the die accesses the reference resistor 204 and matches the tunable resistors in the calibration leg and the tunable resistors in the replica calibration leg to the value of the reference resistor 204. The reference resistor 204 may be a relatively high quality resistor with a high precision. If multiple memory die require a calibration the calibration scheduling logic 242 may determine an order in which to issue the calibration commands FIG. 3 is a block diagram of a calibration detection circuit according to some embodiments of the present disclosure. FIG. 3 shows a calibration detection circuit 302 and I/O circuit 320. The calibration detection circuit 302 may, in some embodiments, implement the calibration detection circuit 130 of FIG. 1 and/or 213, 217, 233, and/or 237 of FIG. 2. The 10 circuit 320 may, in some embodiments, implement the 10 circuit 122 of FIGS. 1 and/or 214, 218, 234, and/or 238 of FIG. 2.

The IO circuit 320 includes a termination circuit 322 (e.g., 123 of FIG. 1). The termination circuit 322 includes a number of selectable resistive legs 324, each of which includes a tunable resistor. Based on a number of the selectable resistive legs 324 which are active, the termination circuit 322 determines an impedance of the DQ terminals.

The calibration detection circuit 302 includes a replica resistive leg 310, which replicates one of the resistive legs 324 of the termination circuit. The replica resistive leg 310 includes a tunable resistor 312 which mimics the tunable resistors of the resistive legs 324. In some embodiments, the replica resistive leg 310 may be physically similar to the resistive legs 324. For example, the replica resistive leg 310 may have the same components of the resistive legs 324, may be laid out in a similar fashion, and so forth. In some embodiments, the replica resistive leg 310 may be physically proximate to the resistive legs 324 of the termination circuit 322. For example, the replica resistive leg 310 may be next to the 10 circuit 320 and/or the DQ terminals. In some embodiments, the resistor 312 may be positioned next to or in-between the resistive legs 324. In some embodiments, the replica resistive leg 310 may be positioned in a region of the apparatus near the input/output circuit 320 (e.g., the calibration detection circuit 302 may be along an edge of the memory near the DQ pads rather than in a bank logic region or other region of the memory).

The calibration detection circuit 302 includes a calibration sensor 304 which measures a resistance of the resistor 312 in the replica resistive leg 310. The calibration sensor 304 provides a signal OUT which is at an logical high level to indicate that the measured resistance is within a tolerance (e.g., an inactive state) and which is at a logical low level to indicate that the measured resistance is outside the tolerance (e.g., an active state).

The calibration detection circuit 302 includes a command generator circuit 308 which provides a calibration request signal ZQRqst responsive to the signal OUT going from inactive to active (e.g., falling to a low logical level). The calibration detection circuit 302 may include an optional filter circuit 306. The filter circuit 306 may be used to ensure that changes to OUT which are transient to not lead to the calibration request signal ZQRqst being provided. For example, the filter circuit 306 may be a windowing circuit which only provides the change in OUT to the command generator 308 if the signal OUT changes to a low logical level and remains at that level for at least a period of time.

Figure 4:
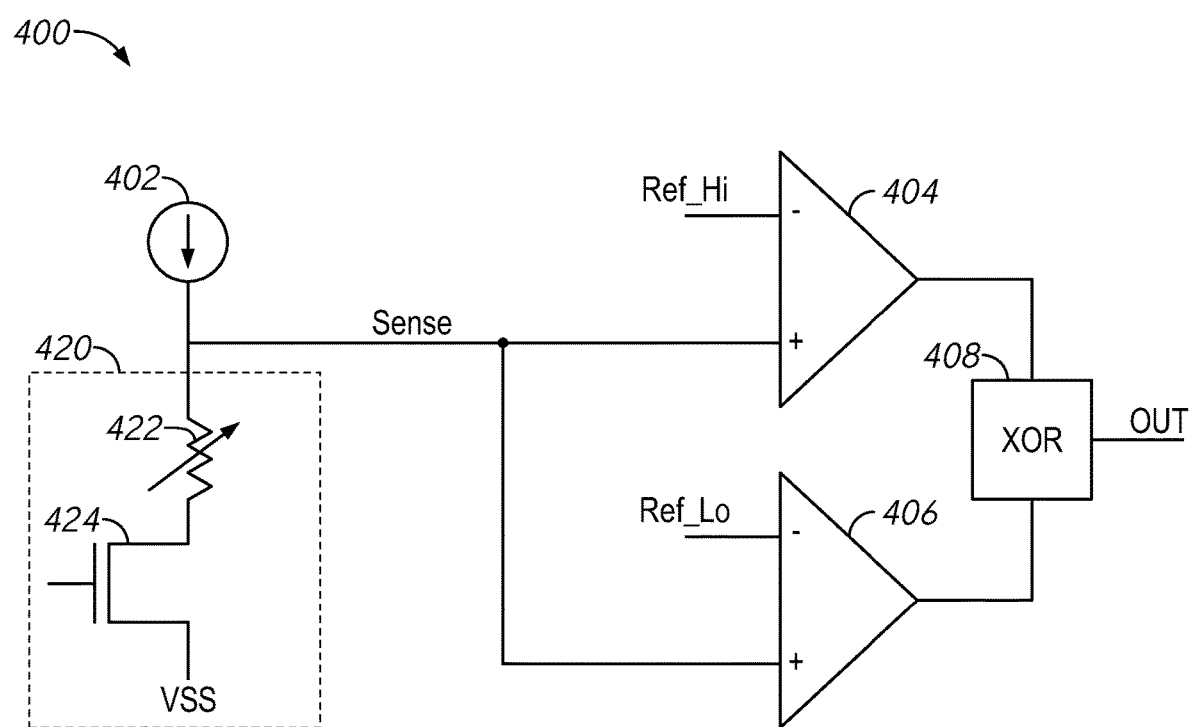
FIG. 4 is a schematic diagram of a calibration sensor circuit and a replica resistive leg according to some embodiments of the present disclosure.

FIG. 4 is a schematic diagram of a calibration sensor circuit and a replica resistive leg according to some embodiments of the present disclosure. The calibration sensor circuit 400 may, in some embodiments, implement the calibration sensor circuit 304 of FIG. 3. The replica resistive leg 420 may, in some embodiments, implement the replica resistive leg 310 of FIG. 3.

The replica resistive leg 420 includes a tunable resistor 422 and a transistor 424. The resistor is coupled between a signal line Sense and a first node of the transistor 424 (e.g., to a source), while a second node of the transistor (e.g., a drain) is coupled to a ground voltage VSS. A gate of the transistor 424 is coupled to a signal which activates the replica resistive leg 420. Since the resistive leg 420 is a replica resistive leg, the control signal may be set to an active level (e.g., a high logical level) to allow the resistor 422 to couple the signal line Sense to the ground voltage VSS. Each of the resistive legs of the termination circuit may have similar components, except their transistors have gates coupled to control signals used to determine how many of the resistive legs are active.

The calibration sensor circuit 400 includes a current source 402 which provides a current to the signal line Sense. The current in turn flows through the resistor 422 to ground, generating a voltage on Sense which is based on the resistance of the resistor 422 by Ohm's law. Accordingly, the voltage on Sense may act as a measure the resistance of the resistor 422.

The calibration sensor circuit 400 includes a first comparator circuit 404 and a second comparator circuit 406. The first comparator has a positive terminal coupled to Sense and a negative terminal coupled to a high reference voltage Ref_Hi. The second comparator has a positive terminal coupled to Sense and a negative terminal coupled to a low reference voltage Ref_Lo. The outputs of the two comparators 404 and 406 are coupled to the inputs of an XOR gate 408. The output of the XOR gate is the signal OUT.

The voltage Ref_Hi and Ref_Lo are chosen to set tolerances for the value of the resistor 422. The values of the voltages Ref_Hi and Ref_Lo may be chosen based on the expected value of the resistor 422 and the current provided by the current source 402 (e.g., the expected voltage on Sense). The voltage Ref_Hi may represent a high reference voltage (e.g., an upper tolerance for the resistance of the resistor 422) and the voltage Ref_Lo may represent a low reference voltage (e.g., e.g., a lower tolerance for the resistance of the resistor 422). For example, if the voltage on sense is expected to be 0.5V, then the value of Ref_Hi may be 0.565V and the value of Ref_Lo may be 0.535V. Other voltages may be used in other examples.

Accordingly, when the voltage on Sense is between Ref_Hi and Ref_Lo, the output of the first comparator 404 is low while the output of the second comparator 406 is high and the signal OUT is high. When the voltage on Sense is above Ref_Hi, then the outputs of both comparators 404 and 406 is high, and the signal OUT is low. When the voltage on Sense is below Ref_Lo, then the outputs of both comparators 404 and 406 are low, and the signal OUT is low. Thus, the signal OUT transitioning from a logical high to a logical low may indicate that the voltage on Sense has risen above the high reference voltage Ref_Hi or fallen below the low reference voltage Ref_Lo.

Figure 5:
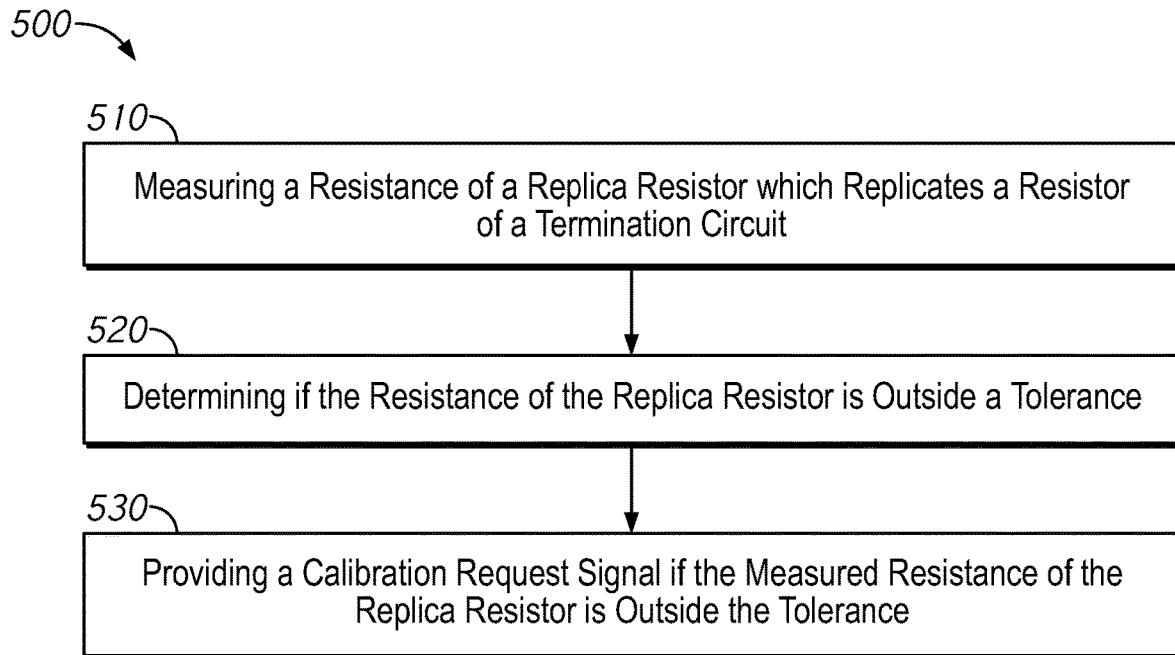
FIG. 5 is a flow chart of a method according to some embodiments of the present disclosure.

FIG. 5 is a flow chart of a method according to some embodiments of the present disclosure. The method 500 may, in some embodiments be implemented by one or more of the apparatuses or systems described in FIGS. 1-4. For example, the method 500 may represent a method of DRAM directed calibration detection, and may be performed by the memory 100 of FIG. 1, and/or one or more of the memories 212, 216, 232, and/or 236 of FIG. 2.

The method 500 includes block 510, which describes measuring a resistance of a replica resistor which replicates a resistor of a termination circuit. The replica resistor (e.g., 312 of FIGS. 3 and/or 422 of FIG. 4) may be part of a calibration detection circuit (e.g., 130 of FIGS. 1, 213, 217, 233, and/or 237 of FIG. 2, 302 of FIGS. 3 and/or 400 of FIG. 4). The measuring may include running a current through the replica resistor to generate a voltage.

Block 510 may generally be followed by block 520, which describes determining if the resistance is outside a tolerance. The method 500 may include providing a signal (e.g., OUT of FIGS. 3-4) if the resistance is outside the tolerance.

In an example embodiment of the measuring and the determining of blocks 510 and 520, the method 500 may include generating a voltage based on a value of the replica resistor and determining if the voltage is within a tolerance. For example, the measuring may include running a current through the replica resistor to generate a voltage (e.g., Sense of FIG. 4). The measuring may include comparing the voltage to an upper tolerance voltage and a lower tolerance voltage (e.g., with comparator circuits 404 and 406 of FIG. 4). The method 500 may include providing the signal if the voltage is above the upper tolerance voltage or below the lower tolerance voltage.

Block 520 may generally be followed by block 530, which describes providing a calibration request signal if the measured resistance of the replica resistor is outside the tolerance. The calibration request signal may be provided responsive to the signal. The method 500 may include providing the calibration request signal to a controller of the memory, and receiving a calibration command from the controller.

In some embodiments, the method 500 may include filtering the signal provided based on the determination that the resistance is outside the tolerance and providing the calibration request based on the filtered signal. For example, the filtered signal may become active if the signal is active for at least a period of time.

The method 500 may include performing a calibration responsive to a calibration command generated by the controller in response to the calibration request signal. The calibration may include accessing a calibration resistor (e.g., 204 of FIG. 2) and matching a value of the resistor of the termination circuit and a value of the replica resistor to a value of the calibration resistor.

In some embodiments, the method 500 may include activating a selected number of resistive legs of the termination circuit to set an overall impedance of the termination circuit. Each resistive leg may include a resistor. During a calibration operation, each of the resistors of each of the resistive legs may be matched to the value of the calibration resistor.

Figure 6:
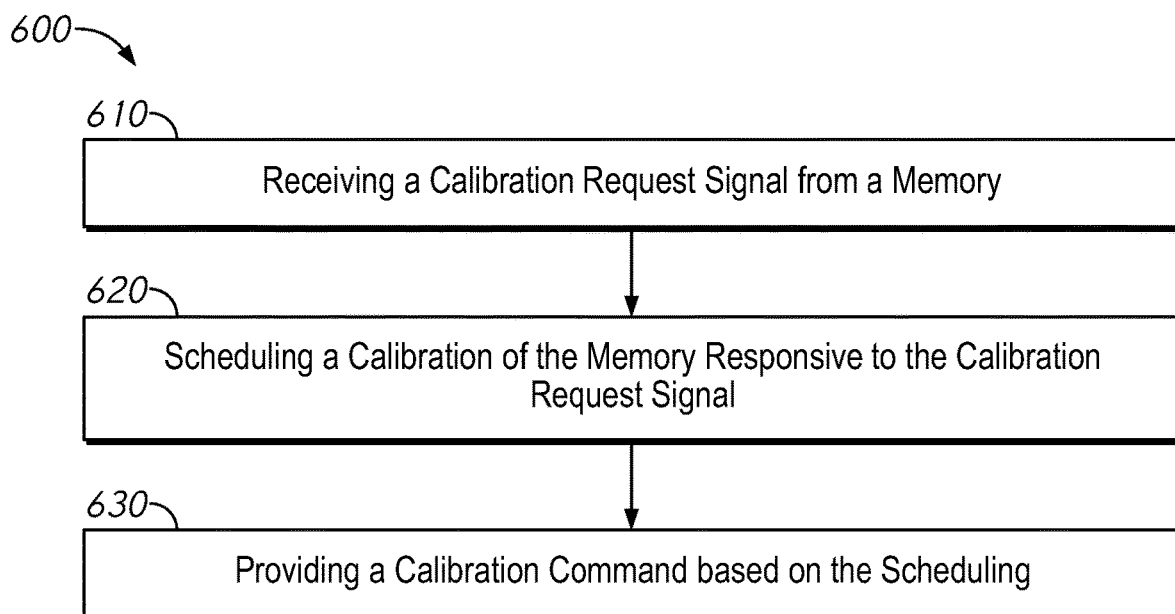
FIG. 6 is a flow chart of a method according to an embodiment of the present disclosure.

FIG. 6 is a flow chart of a method according to an embodiment of the present disclosure. The method 600 may, in some embodiments, be implemented by one or more of the apparatuses and systems of FIGS. 1-4. For example, the method 600 may represent a method of calibrating memories based on request signals from the memory, and may be implemented by the controller 140 of FIGS. 1 and/or 240 of FIG. 2.

The method 600 includes box 610, which describes receiving a calibration request signal from a memory. The method 600 may include receiving the calibration request signal at a controller of the memory. The method 600 may include receiving the calibration request signal along an in-band channel (e.g., along the DQ bus) or along a sideband channel (e.g., via one or more non-DQ channels). The calibration request signal may be provided by the memory based on the memory determining that a replica resistor has a resistance outside a tolerance (e.g., the method 500 of FIG. 5).

Block 610 may generally be followed by block 620, which describes scheduling a calibration of the memory responsive to the calibration request signal. For example, the method 600 may include receiving calibration scheduling requests from the memory at a calibration scheduling logic circuit. The method 600 may include determining, with the calibration scheduling logic when to provide the calibration command. For example, the method 600 may include receiving a first calibration request signal from a first memory and receiving a second calibration request signal from a second memory. The method 600 may include determining when to provide a first calibration command to the first memory and when to provide a second calibration command to the second memory. For example, the first calibration command may be provided at a first time and the second calibration command may be provided at a second time different than the first time.

Block 620 may generally be followed by block 630, which describes providing a calibration command to the memory based on the scheduling. The method may include the memory performing a calibration operation responsive to the calibration command. In some embodiments, the method 600 may include providing a calibration command when a calibration request has not been provided for a period of time.

As used herein, an activation of a signal may refer to any portion of a signals waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level. One of skill in the art should understand that although embodiments may be described with respect to a particular type of activation used by a particular circuit (e.g., active high), other embodiments may use other types of activation (e.g., active low).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a termination circuit including a tunable resistor; and
   a calibration detection circuit including a replica tunable resistor, wherein the calibration detection circuit is configured to measure a resistance of the replica tunable resistor and provide a calibration request signal responsive to the measured resistance being outside a tolerance.

2. The apparatus of claim 1, further comprising a reference resistor,
   wherein responsive to a calibration command a resistance of the tunable resistor in the termination circuit and the resistance of the replica tunable resistor are matched to a resistance of the reference resistor, and wherein a controller provides the calibration command responsive to the calibration request signal.

3. The apparatus of claim 1, wherein the calibration detection circuit includes:
   a current source configured to generate a voltage based on the resistance of the replica tunable resistor;
   a comparator circuit configured to provide a signal if the voltage is above an upper threshold voltage or below a lower threshold voltage; and
   a command generator circuit configured to provide the calibration request signal based on the signal.

4. The apparatus of claim 3, wherein the calibration detection circuit further includes a filter configured to provide a filtered signal based on the signal, wherein the command generator circuit is configured to provide the calibration request signal responsive to the filtered signal.

5. The apparatus of claim 1, wherein the termination circuit includes a plurality of resistive legs, each comprising one of a plurality of tunable resistors, wherein a selected number of the plurality of resistive legs are activated to set an overall impedance of the termination circuit.

6. The apparatus of claim 1, wherein the replica tunable resistor and the tunable resistor are in physical proximity to each other.

7. The apparatus of claim 1, further comprising a memory array and data terminals configured to send and receive data to and from the memory array, wherein the termination circuit is coupled to the data terminals.

8. A system comprising:
   a memory module including a memory, the memory comprising:
     a termination circuit including a tunable resistor; and
     a calibration detection circuit including a replica tunable resistor, wherein the calibration detection circuit is configured to measure a resistance of the replica tunable resistor and provide a calibration request responsive to the measured resistance being outside a tolerance; and
   a controller comprising:
     a calibration scheduling logic circuit configured to provide a calibration command to the memory responsive to the calibration request.

9. The system of claim 8, wherein the memory is configured to calibrate a resistance of the tunable resistor and the resistance of the replica tunable resistor responsive to the calibration command.

10. The system of claim 8, wherein the memory module includes a second memory, the second memory comprising:
    a second termination circuit including a second tunable resistor; and
    a second calibration detection circuit including a second replica tunable resistor, wherein the second calibration detection circuit is configured to measure a resistance of the second replica tunable resistor and provide a second calibration request responsive to the measured resistance being outside a tolerance.

11. The system of claim 10, wherein the controller is configured to receive the first calibration request signal from the first memory and the second calibration request signal from the second memory, and provide a first calibration command to the first memory and a second calibration command to the second memory.

12. The system of claim 11, wherein the first calibration command is provided at a first time and the second calibration command is provided at a second time different than the first time.

13. The system of claim 8, wherein the memory module further includes a reference resistor, wherein responsive to the calibration command a resistance of the tunable resistor is matched to a resistance of the reference resistor.

14. A method comprising:
    measuring a resistance of a replica resistor which replicates a resistor of a termination circuit;
    determining if the resistance of the replica resistor is outside a tolerance; and providing a calibration request signal if the measured resistance of the replica resistor is outside the tolerance.

15. The method of claim 14, further comprising:
generating a voltage based on the resistance of the replica resistor;
comparing the voltage to a first threshold voltage and a second threshold voltage; and
providing a signal if the voltage is above the first threshold voltage or below the second threshold voltage, wherein the calibration request signal is provided based on the signal.

16. The method of claim 15, further comprising filtering the signal, and providing the calibration request signal responsive to the filtered signal.

17. The method of claim 14, further comprising:
receiving a calibration command from a controller, wherein the controller provides the calibration command responsive to the calibration request signal; and
calibrating the resistor of the termination circuit responsive to the calibration command.

18. The method of claim 17, wherein calibrating the resistor includes matching a resistance of the resistor to a resistance of a reference resistor.

19. A method comprising:
receiving a calibration request signal from a memory;
scheduling a calibration of the memory responsive to the calibration request signal; and
providing a calibration command to the memory based on the scheduling.

20. The method of claim 19, further comprising:
receiving a second calibration request signal from a second memory;
scheduling the calibration of the memory and second calibration of the second memory; and
providing the calibration command to the memory at a first time and providing a second calibration command to the second memory at a second time.

21. The method of claim 19, further comprising providing the calibration command if the calibration request signal is not received for a period of time.

* * * * *